United States Patent
Kitada

(10) Patent No.: US 8,400,366 B2
(45) Date of Patent: Mar. 19, 2013

(54) RADIATION EFFICIENCY MEASURING APPARATUS AND RADIATION EFFICIENCY MEASURING METHOD

(75) Inventor: Hiroshi Kitada, Kanagawa-ken (JP)

(73) Assignee: Murata Manufacturing Co., Ltd. (JP)

( * ) Notice: Subject to any disclaimer, the term of this patent is extended or adjusted under 35 U.S.C. 154(b) by 498 days.

(21) Appl. No.: 12/606,850

(22) Filed: Oct. 27, 2009

(65) Prior Publication Data

US 2010/0045543 A1    Feb. 25, 2010

Related U.S. Application Data

(63) Continuation of application No. PCT/JP2008/057575, filed on Apr. 18, 2008.

(30) Foreign Application Priority Data

May 7, 2007    (JP) ................................. 2007-122448

(51) Int. Cl.
     *G01R 29/10*          (2006.01)
(52) U.S. Cl. .......................... 343/703; 343/780; 343/894
(58) Field of Classification Search .................. 343/703, 343/720, 763, 765, 766; 324/617, 627–628; 455/423, 67.11
See application file for complete search history.

(56) References Cited

U.S. PATENT DOCUMENTS

| | | | |
|---|---|---|---|
| 4,968,983 A | | 11/1990 | Maeda |
| 5,300,939 A | * | 4/1994 | Maeda et al. ................. 343/703 |
| 6,556,023 B2 | * | 4/2003 | Okazaki ........................ 324/637 |
| 6,844,854 B2 | * | 1/2005 | Johnson et al. .............. 343/702 |
| 7,609,071 B2 | * | 10/2009 | Iwai et al. ..................... 324/632 |
| 7,925,253 B2 | * | 4/2011 | Breit et al. ..................... 455/425 |
| 8,022,713 B2 | * | 9/2011 | Jung et al. ..................... 324/637 |
| 2009/0219217 A1 | * | 9/2009 | Kitada et al. ................. 343/703 |

FOREIGN PATENT DOCUMENTS

| | | |
|---|---|---|
| JP | 2-163668 | 6/1990 |
| JP | 2-238375 | 9/1990 |
| JP | 2000-214201 A | 8/2000 |
| JP | 2000-338155 A | 12/2000 |
| JP | 2001-343409 A | 12/2001 |
| JP | 2006-086875 A | 3/2006 |

OTHER PUBLICATIONS

Yutaka, Translated version of Japan Patent JP2000214201, Aug. 2000.*
The Examination results from the Korean Intellectual Property Office dated Mar. 24, 2011 Korean Patent Application No. 10-2009-7022553.
"International Search Report"; PCT/JP2008/057575; Jun. 17, 2008.
Hisashi Yoshida; "Written Opinion of the International Searching Authority"; PCT/JP2008/057575; Jun. 17, 2008.
Translation of German Office Action dated Feb. 3, 2011; German Application No. 11 2008 001 091.9-35.

* cited by examiner

*Primary Examiner* — Douglas W Owens
*Assistant Examiner* — Collin Dawkins
(74) *Attorney, Agent, or Firm* — Studebaker & Brackett PC; Tim L. Brackett, Jr.; John F. Guay

(57) ABSTRACT

A target antenna 4A to be measured and a measuring antenna 5 are placed within an anechoic chamber 1. A first azimuth angle plane radiation pattern $S21(R,\theta,\phi)$ is measured using a network analyzer 7 with an elevation angle $\phi$ of the target antenna 4A fixed to a first angle $\phi1$. Next, a second azimuth angle plane radiation pattern $S21(R,\theta,\phi)$ is measured using the network analyzer 7 with the elevation angle $\phi$ of the target antenna 4A fixed to a second angle $\phi2$ different from the first angle $\phi1$ by 90 degrees. A radiation efficiency of the target antenna 4A is measured by integrating in a spherical shape the azimuth angle plane radiation patterns $S21(R,\theta,\phi)$ at two planes.

6 Claims, 4 Drawing Sheets

RADIATION EFFICIENCY MEASURING APPARATUS AND RADIATION EFFICIENCY MEASURING METHOD

CROSS REFERENCE TO RELATED APPLICATIONS

The present application is a continuation of International Application No. PCT/JP2008/057575, filed Apr. 18, 2008, which claims priority to Japanese Patent Application No. 2007-122448 filed May 7, 2007, the entire contents of each of these applications being incorporated herein by reference in their entirety.

BACKGROUND OF THE INVENTION

1. Field of the Invention

The present invention relates to a radiation efficiency measuring apparatus and a radiation efficiency measuring method for measuring a radiation efficiency of an antenna for use in a cellular phone or the like.

2. Description of the Related Art

An apparatus for measuring a radiation efficiency or the like of an antenna used in a cellular phone or the like is known and generally discussed in, for example, Japanese Unexamined Patent Application Publication (Translation of PCT Application) No. 2000-214201, Japanese Unexamined Patent Application Publication (Translation of PCT Application) No. 2000-338155, and Japanese Unexamined Patent Application Publication (Translation of PCT Application) No. 2-163668.

Japanese Unexamined Patent Application Publication No. 2000-214201 discloses a measuring apparatus. In order to evaluate antenna performance for a short period of time, the disclosed measuring apparatus measures the radiation efficiency of a cellular terminal antenna as a target antenna with the number of segments toward an elevation angle of the cellular terminal antenna reduced.

Japanese Unexamined Patent Application Publication No. 2000-338155 discloses a measuring system. The disclosed measuring system employs two measuring antennas, one for horizontally polarized wave and the other for vertically polarized wave. The system measures quickly the data of two polarized waves of a target antenna by switching between the two measuring antennas at a high speed.

Japanese Unexamined Patent Application Publication No. 2-163668 discloses an electromagnetic radiation measuring device. The disclosed electromagnetic radiation measuring device measures an electromagnetic radiation over the whole solid angle of a target object to be measured, such as a cellular phone, determines arrival probabilities of a horizontally polarized wave and a vertically polarized wave to the target object. The device then determines an effective radiation power using a weight function resulting from normalizing the arrival probability.

Japanese Unexamined Patent Application Publication No. 2000-214201 discloses that, if the number of segments to the elevation angle to the cellular terminal antenna is set to be 4, a measurement error of a radiation efficiency falls within about 3 dB at maximum. However, Japanese Unexamined Patent Application Publication No. 2000-214201 does not disclose a specific calculation method of the radiation efficiency. In addition, the measuring apparatus disclosed in Japanese Unexamined Patent Application Publication No. 2000-214201 can result in a measurement error of about 3 dB, which is an undesirably low measurement accuracy.

The measuring system disclosed in Japanese Unexamined Patent Application Publication No. 2000-338155 measures a radiated electromagnetic field of the target antenna in the whole solid angle, and then determines the radiation efficiency by integrating the radiated electromagnetic field over the whole solid angle. For this reason, the measuring system disclosed in Japanese Unexamined Patent Application Publication No. 2000-338155 requires a long period of time for measurement. Moreover, a moving mechanism for moving the measuring antenna across the whole solid angle becomes bulky. According to Japanese Unexamined Patent Application Publication No. 2000-338155, the radiation efficiency is calculated by summing radiation powers over the whole solid angle. The radiation efficiency calculated is different from the originally defined radiation efficiency that is determined from calculating a ratio of a radiated power to an input power (radiated power/input power). Furthermore, the accuracy of the radiation efficiency calculated is not known.

The measuring device disclosed in Japanese Unexamined Patent Application Publication No. 2-163668 needs to measure the radiated electromagnetic field over the whole solid angle of the target object, such as the cellular phone, and thus requires a long measurement time as the measuring system disclosed in Japanese Unexamined Patent Application Publication No. 2000-338155.

In order to determine the effective radiation power, the measuring device disclosed in Japanese Unexamined Patent Application Publication No. 2-163668 also needs to determine the arrival probabilities of the horizontally polarized wave and the vertically polarized wave from data that is obtained by measuring the radiated electromagnetic field over the whole solid angle, and to calculate the radiation efficiency with the arrival probability weighted. The calculation method thus becomes complex, and the radiation efficiency cannot be calculated easily. Furthermore, since the radiated electromagnetic field is measured over the whole solid angle of the target object, the mechanism to control the target object to the elevation angle is required. The rotation mechanism thus becomes bulky and is difficult to be used in a compact anechoic chamber or the like.

SUMMARY OF THE INVENTION

The present invention has been developed in view of the above-described problems, and it is an object of the present invention to provide a radiation efficiency measuring device that permits a compact design and short measurement time and a radiation efficiency measuring method thereof.

In order to achieve the above-mentioned object, an embodiment of a radiation efficiency measuring apparatus of the present invention for solving the above-described problems includes a target antenna to be measured, a measuring antenna arranged at a position spaced apart from the target antenna by a distance dimension of R, an electromagnetic field measuring device, connected to the measuring antenna, for measuring an electromagnetic field radiated by the target antenna, elevation angle switching means for switching an elevation angle $\phi$ of the target antenna between first and second angles $\phi 1$ and $\phi 2$, which are different from each other by 90 degrees, azimuth angle rotation means for rotating the target antenna to an azimuth angle $\theta$, first radiation pattern measuring means for causing the azimuth angle rotation means to rotate the target antenna to a azimuth angle $\theta$ with the elevation angle $\phi$ of the target antenna switched to the first angle $\phi 1$ by the elevation angle switching means, and measuring a first azimuth angle plane radiation pattern $S21(R,\theta,\phi)$ with the electromagnetic field measuring device, second radiation pattern measuring means for causing the azimuth angle rotation means to rotate the target antenna to the azimuth angle θ with the elevation angle φ of the target antenna switched to the second angle φ2 by the elevation angle switching means, and measuring a second azimuth angle plane radiation pattern S21(R,θ,φ) with the electromagnetic field measuring device, and radiation efficiency calculating means for calculating a radiation efficiency η of the target antenna on the basis of the first and second azimuth angle plane radiation patterns S21(R,θ,φ) measured by the first and second radiation pattern measuring means, wherein $$\eta = \frac{4\pi R^2 \sum_\theta \sum_\phi S21^2(R, \theta, \phi)\sin\theta\Delta\phi\Delta\theta}{\lambda^2 G}$$

where λ represents a wavelength of a measuring frequency, G represents a gain of the measuring antenna, Δφ represents a measuring angle step in the elevation angle φ direction, and Δθ represents a measuring angle step in the azimuth angle θ direction.

In accordance with the present invention, the radiation efficiency η is calculated on the basis of the first and second azimuth angle plane radiation patterns S21(R,θ,φ) measured using the first and second radiation pattern measuring means. It thus suffices if the radiation patterns at the azimuth angle direction of the target antenna at two planes of angles φ1 and φ2 with respect to the elevation angle φ are measured. Therefore, measurement time is short in comparison with the measurement of radiated electromagnetic fields performed over the whole solid angle.

Since the elevation angle switching means switches the elevation angle φ of the target antenna between the first and second angles φ1 and φ2, a mechanism permitting the target antenna to be switched between the two angles φ1 and φ2 suffices. Accordingly, the elevation angle switching means is simplified, and the whole apparatus is compactly structured.

In accordance with another embodiment of the present invention, a radiation pattern of the main beam of the target antenna is preferably symmetrical with respect to the elevation φ direction.

With the symmetry of the radiation pattern of the main beam, the radiation pattern is measured at the two planes of the two angles φ1 and φ2 different by 90 degrees from each other in the elevation angle φ, and the radiation pattern is then spherically integrated. The radiation efficiency of the target antenna is thus measured at an accuracy level approximately equal to the accuracy level at which the radiation pattern is measured over the whole solid angle.

More specifically, if the target antenna has the radiation pattern being symmetrical with respect to the elevation angle φ, calculation results of radiation efficiency are substantially equal to each other between the radiation efficiency that is determined by spherically integrating the azimuth angle direction radiation patterns at two planes of elevation angles φ different from each other by 90 degrees and the radiation efficiency that is determined by integrating the radiation pattern over the whole solid angle.

In particular, if the Voltage Standing Wave Ratio of the target antenna is limited to within 1-3, the effect of a cable connecting to the target antenna is eliminated. The radiation pattern becomes constant, and the radiation efficiency of the target antenna is measured with a measurement error to within ±1 dB.

Since the radiation efficiency is chiefly determined by the main beam, it suffices if the symmetry of the radiation pattern takes place in the main beam. Thus, symmetry of sidelobes is not necessary.

In another embodiment, a radiation efficiency measuring method of the present invention for measuring a radiation efficiency of a target antenna with a measuring antenna with the target antenna and the measuring antenna spaced apart by a distance dimension of R, includes a first radiation pattern measuring step of measuring a first azimuth angle plane radiation pattern S21(R,θ,φ) with the target antenna rotated to an azimuth angle θ in a state that an elevation angle φ of the target antenna is switched to a first angle φ1, a second radiation pattern measuring step of measuring a second azimuth angle plane radiation pattern S21(R,θ,φ) with the target antenna rotated to the azimuth angle θ in a state that the elevation angle φ of the target antenna is switched to a second angle φ2, the second angle φ2 different from the first angle φ1 by 90 degrees, and a radiation efficiency calculating step of calculating a radiation efficiency η of the target antenna on the basis of the first and second azimuth angle plane radiation patterns S21(R,θ,φ) measured in the first and second radiation pattern measuring steps, wherein $$\eta = \frac{4\pi R^2 \sum_\theta \sum_\phi S21^2(R, \theta, \phi)\sin\theta\Delta\phi\Delta\theta}{\lambda^2 G}$$

where λ represents a wavelength of a measuring frequency, G represents a gain of the measuring antenna, Δφ represents a measuring angle step in the elevation angle φ direction, and Δφ represents a measuring angle step in the azimuth angle θ direction.

In accordance with the embodiment of the present invention, the radiation efficiency η is calculated on the basis of the first and second azimuth angle plane radiation patterns S21(R,θ,φ) measured in the first and second radiation pattern measuring steps. It thus suffices if the radiation patterns at the azimuth angle direction of the target antenna at two planes of the two angles φ1 and φ2 in the elevation angle φ are measured. Therefore, measurement time is short in comparison with the measurement of radiated electromagnetic fields performed over the whole solid angle.

In accordance with an embodiment of the radiation efficiency measuring method of the present invention, a radiation pattern of the main beam of the target antenna is symmetrical with respect to the elevation angle φ direction.

With the symmetry of the radiation pattern of the main beam, the radiation pattern is measured at the two planes of the two angles φ1 and φ2 different from each other by 90 degrees in the elevation angle φ and the radiation pattern is then spherically integrated. The radiation efficiency of the target antenna is thus measured at an accuracy level approximately equal to the accuracy level at which the radiation pattern is measured over the whole solid angle.

DESCRIPTION OF THE PREFERRED EMBODIMENTS

A radiation efficiency measuring apparatus of an embodiment of the present invention is described below with reference to the accompanying drawings.

Figure 1:
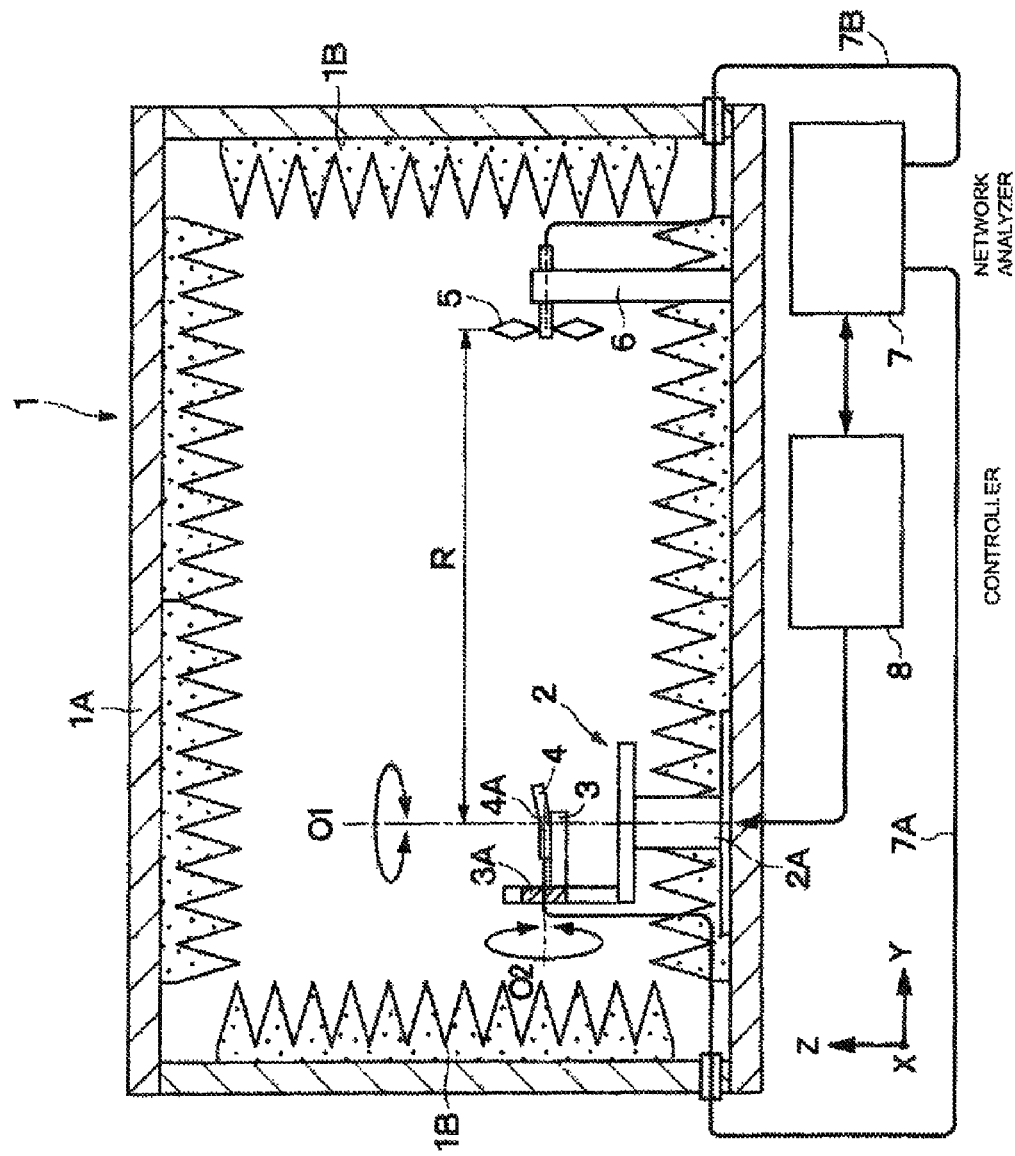
FIG. 1 is a front view illustrating an antenna characteristic measuring apparatus in accordance with one embodiment of the present invention.
Figure 2:
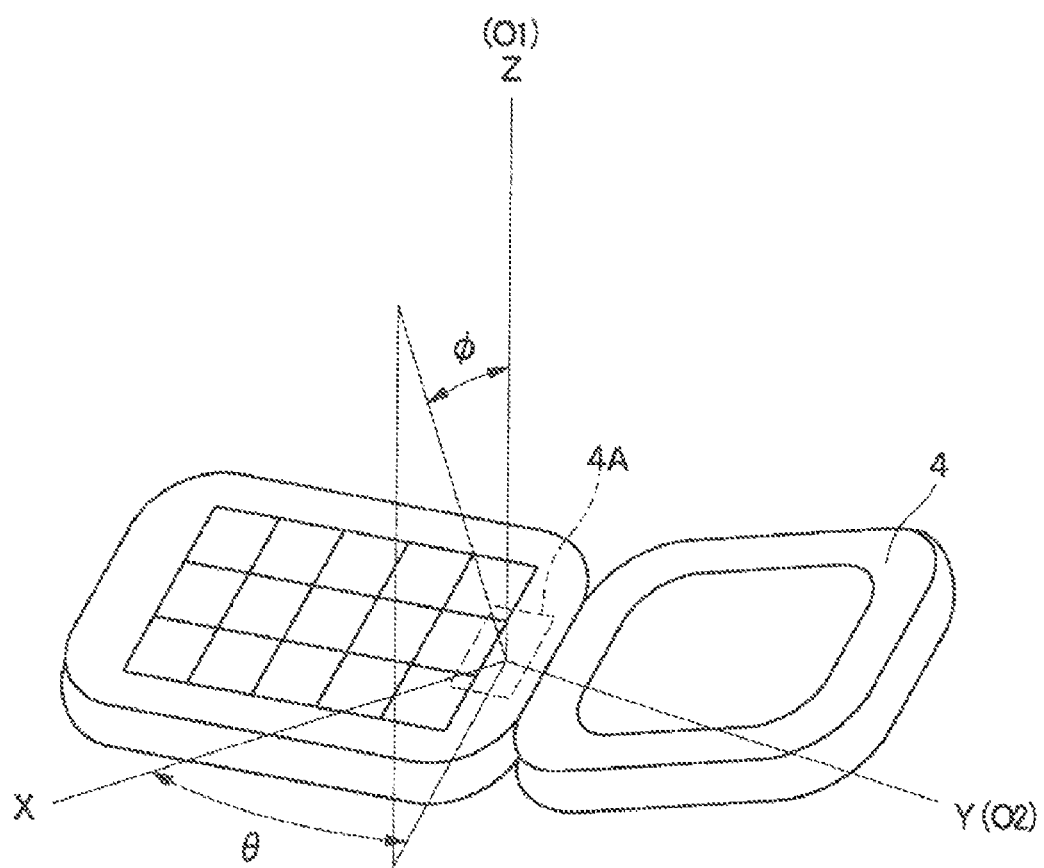
FIG. 2 is a perspective view illustrating in enlargement the external outline of a target antenna of FIG. 1 to be measured.

Referring to FIG. 1, an anechoic chamber 1 includes a chamber 1A made of aluminum plates having a thickness of 1-2 mm and a radiowave absorber 1B arranged within the chamber 1A. The size dimensions of the anechoic chamber 1 range are within about 50-100 cm in a width direction (X direction), a length direction (Y direction), and a height direction (Z direction). The anechoic chamber 1 blocks electromagnetic waves from the outside while preventing internal electromagnetic waves from reflecting therewithin.

An azimuth table 2 constitutes the azimuth angle rotation means and is arranged close to the left inner wall surface of the anechoic chamber 1, for example. The azimuth table 2 includes a rotation driver 2A such as a drive motor, and rotates driven by the rotation driver 2A to an azimuth angle θ around an O1 axis in parallel with the height direction.

A target object support member 3 supporting a target object 4 to be measured is arranged on the azimuth table 2. The target object support member 3 includes an elevation angle switch 3A as the elevation angle switching means. The elevation angle switch 3A can be set between two positions in the elevation angle φ around an O2 axis in parallel with the longitudinal direction (i.e., left-right direction) of the anechoic chamber 1. The elevation angle switch 3A is switched between the first and second angles φ1 and φ2 (0 and 90 degrees, for example) in the elevation angle φ.

The target object 4 is mounted on the elevation angle switch 3A. The azimuth table 2 and the elevation angle switch 3A determine the azimuth angle θ and the elevation angle φ of the target object 4 with a target antenna 4A by rotating the target object 4 about the O1 axis and the O2 axis mutually perpendicular to each other.

The target object 4 is fixed to an end portion of the elevation angle switch 3A, and is rotated about two axes of O1 and O2 using the azimuth table 2 and the elevation angle switch 3A. For example, the target object 4 includes a cellular phone, a cellular terminal, or the like, and is provided with the target antenna 4A, the radiation efficiency of which is to be measured. The target antenna 4A may include a whip antenna, an internal chip antenna, or the like.

Furthermore, a mobile communication apparatus, such as the cellular phone, transmits and receives signals (i.e., electromagnetic waves) to and from a base station at any place. For this reason, when the mobile communication apparatus is used as the target object 4, the target antenna 4A has the same directivity as a dipole antenna or a monopole antenna. In this way, the target antenna 4A has a radiation pattern centered thereon symmetrical in the elevation angle φ direction and the azimuth angle θ direction.

If the voltage standing wave ratio of the target antenna 4A rises above 3, matching performance of the target antenna 4A may become poor, and the radiation pattern (i.e., directivity) may change. For this reason, the voltage standing wave ratio of the target antenna 4A is preferably set to be within a range of about 1-3.

A measuring antenna 5 is arranged close to the right inner wall of the anechoic chamber 1. The measuring antenna 5 is fixed to a measuring antenna support member 6. The measuring antenna 5 is thus arranged to face the target object 4 at a position spaced apart from the target object 4 by a distance dimension of R from the target object 4 in the longitudinal direction (i.e., horizontal direction). The measuring antenna 5 here is a compact biconical antenna, and measures selectively the horizontal polarized wave or the vertical polarized wave. The measuring antenna 5 is designed to switch the polarized wave to be measured, with the measuring antenna support member 6. The measuring antenna 5 is connected to the above-described network analyzer 7.

The network analyzer 7 constitutes the electromagnetic field measuring device that measures an electromagnetic field radiated by the target antenna 4A. The network analyzer 7 is connected to the target antenna 4A via a high-frequency cable 7A. The network analyzer 7 is also connected to the measuring antenna 5 via a high-frequency cable 7B. The network analyzer 7 receives via the measuring antenna 5 the electromagnetic wave (i.e., high-frequency signal) transmitted from the target antenna 4A. In this way, the network analyzer 7 calculates a ratio of a power supplied to the target antenna 4A and a power received by the measuring antenna 5, and thus measures a S matrix parameter S21 corresponding to space loss.

A controller 8 is connected to the rotation driver 2A of the azimuth table 2, the network analyzer 7, and the like, and controls the operation of these elements in accordance with a radiation efficiency measuring program to be discussed later. More specifically, with the elevation angle φ of the target object 4 fixed to a first elevation angle φ1, the controller 8 gradually changes the azimuth angle θ of the target object 4 using the azimuth table 2. The network analyzer 7 then repeats the measurement operation of the parameter S21, thereby measuring a first azimuth angle plane radiation pattern S21(R,θ,φ1).

Also, with the elevation angle φ of the target object 4 fixed to a second elevation angle φ2, the controller 8 gradually changes the azimuth angle θ of the target object 4. The network analyzer 7 then repeats the measurement operation of the parameter S21, thereby measuring a second azimuth angle plane radiation pattern S21(R,θ,φ2). In this way, the controller 8 measures the radiation efficiency η of the target antenna 4A on the basis of two azimuth angle plane radiation patterns S21(R,θ,φ) measured with the network analyzer 7.

The radiation efficiency measuring apparatus of the present embodiment is thus constructed. The radiation efficiency measuring method using the radiation efficiency measuring apparatus is described next with reference to FIG. 3.

First, the target object 4 is mounted on the target object support member 3 on the azimuth table 2. The target object 4 is mounted in the horizontally aligned position thereof. Before starting the measurement, the network analyzer 7 is directly connected to the high-frequency cable 7A for connection with the target object 4 and the high-frequency cable 7B for connection with the measuring antenna 5, and scale correction (i.e., calibration) is performed to compensate for loss of the high-frequency cables 7A and 7B.

Figure 3:
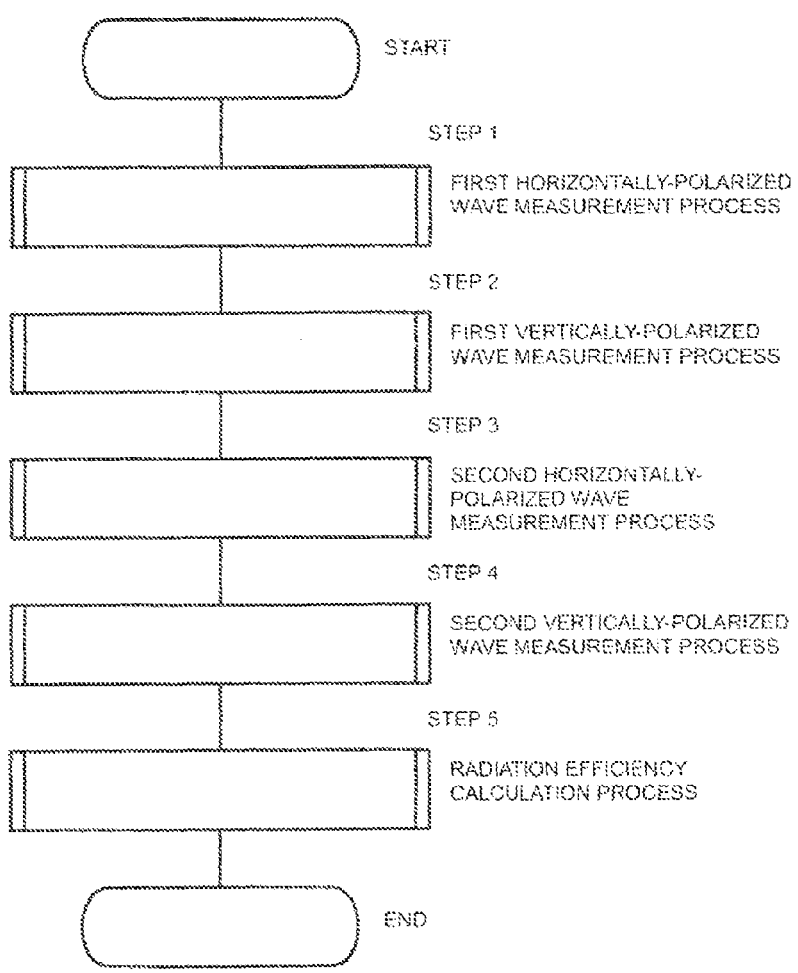
FIG. 3 is a flow chart of a radiation efficiency measuring program.

When the radiation efficiency measuring program is run in this state, a first horizontally polarized wave measurement process is performed in step 1 in FIG. 3. The measuring antenna 5 receives a horizontally polarized wave radiated from the target object 4, more specifically from the target antenna 4A. The elevation angle φ of the target object 4 is fixed to the first elevation angle φ1 (for example, φ1=0 degrees) using the elevation angle switch 3A. With the azimuth table 2 rotated in this state, the parameter S21 at the azimuth angle θ is measured every 10 degrees within an range of the azimuth angle θ of from 0 degrees to 360 degrees. The first azimuth angle plane radiation pattern S21(R,θ,φ1) responsive to the horizontally polarized wave is measured.

After rotating the target antenna 4A by one turn in the azimuth angle θ, processing proceeds to step 2 to perform a first vertically polarized wave measurement process. The polarized wave to be measured with the measuring antenna 5 is switched from the horizontally polarized wave to the vertically polarized wave using the measuring antenna support member 6. As in step 1, the azimuth table 2 is rotated with the elevation angle φ of the target object 4 fixed to the first elevation angle φ1. The parameter S21 is measured every 10 degrees within an range of the azimuth angle θ of from 0 degrees to 360 degrees. The first azimuth angle plane radiation pattern S21(R,θ,φ1) responsive to the vertically polarized wave is thus measured.

When the measurement of the first azimuth angle plane radiation pattern S21(R,θ,φ1) responsive to the vertically polarized wave is complete, the square of the measurement result of the horizontally polarized wave, $S21^2(R,θ,φ1)$, and the square of the measurement result of the vertically polarized wave, $S21^2(R,θ,φ1)$ are added at each azimuth angle θ. The square of the first azimuth angle plane radiation pattern $S21^2(R,θ,φ1)$ is thus finally calculated. In this case, the measurement result of the horizontally polarized wave and the measurement result of the vertically polarized wave are added in antilogarithm converted value rather than measured value in logarithm representation (dB) measured by the network analyzer 7.

Next, in order to perform a second horizontally polarized wave measurement process in step 3, the polarized wave to be measured by the measuring antenna 5 is switched to the horizontally polarized wave using the measuring antenna support member 6. The elevation angle φ of the target object 4 is switched to the second elevation angle φ2 (for example, φ2=90 degrees) using the elevation angle switch 3A. With the azimuth table 2 rotated in this state, the parameter S21 at the azimuth angle θ is measured every 10 degrees. The first azimuth angle plane radiation pattern S21(R,θ,φ1) responsive to the horizontally polarized wave is measured.

After rotating the target antenna 4A by one turn in the azimuth angle θ, processing proceeds to step 4 to perform a second vertically polarized wave measurement process. The polarized wave to be measured with the measuring antenna 5 is switched from the horizontally polarized wave to the vertically polarized wave using the measuring antenna support member 6. As in step 3, the azimuth table 2 is rotated with the elevation angle φ of the target object 4 fixed to the first elevation angle φ2. The parameter S21 is measured every 10 degrees within an range of the azimuth angle θ of from 0 degrees to 360 degrees. The second azimuth angle plane radiation pattern S21(R,θ,φ2) responsive to the vertically polarized wave is thus measured.

When the measurement of the second azimuth angle plane radiation pattern S21(R,θ,φ2) responsive to the vertically polarized wave is complete, the square of the measurement result of the horizontally polarized wave, $S21^2(R,θ,φ2)$, and the square of the measurement result of the vertically polarized wave, $S21^2(R,θ,φ2)$ are added at each azimuth angle θ. The square of the first azimuth angle plane radiation pattern $S21^2(R,θ,φ2)$ is thus finally calculated. As in the case of the first azimuth angle plane radiation pattern S21(R,θ,φ1), the measurement result of the horizontally polarized wave and the measurement result of the vertically polarized wave are added in antilogarithm converted value.

Finally in a radiation efficiency calculation process in step 5, the azimuth angle plane radiation pattern S21(R, θ, φ) based on the measurement result of the horizontally polarized wave and the measurement result of the vertically polarized wave is spherical-surface integrated in the entire space, and the radiation efficiency η of the target antenna 4A is calculated in accordance with Eq. 1.

$$\eta = \frac{4\pi R^2 \sum_\theta \sum_\phi S21^2(R, \theta, \phi) \sin\theta \Delta\phi \Delta\theta}{\lambda^2 G} \quad [\text{Eq. 1}]$$

In equation of Eq. 1, λ represents the wavelength of the measuring frequency, and G represents the gain of the measuring antenna 5. Also, Δφ represents a measuring angle step in the elevation angle φ direction. In the present embodiment, Δφ is 90 degrees (Δφ=π/2 radians). Furthermore, Δθ represents a measuring angle step in the azimuth angle θ direction. In the present embodiment, Δθ is 10 degrees (Δθ=π/18 radians).

The measuring method of the radiation efficiency described above is used in accordance with the present embodiment. The radiation efficiency of an actual cellular phone was thus measured using the above-described measuring method of the radiation efficiency. The measurement results are denoted by blank circles in FIG. 4.

In a comparative example as in the related art, the electromagnetic field was measured over the whole solid angle to determine the radiation efficiency. The results are denoted by solid squares in FIG. 4. The elevation angle φ is varied in steps of 10 within a range of from 0 to 90 degrees. The azimuth angle θ is varied in steps of 10 degrees within a range of from 0 to 360 degrees. The parameter S21 is measured at all the elevation angles φ and all the azimuth angles θ. The measurement results are then spherical-surface integrated in the entire space.

The radiation efficiencies of the present embodiment and the comparative example were measured in two frequency bands (824-960 MHz and 1710-2170 MHz) for use in the cellular phone.

Figure 4:
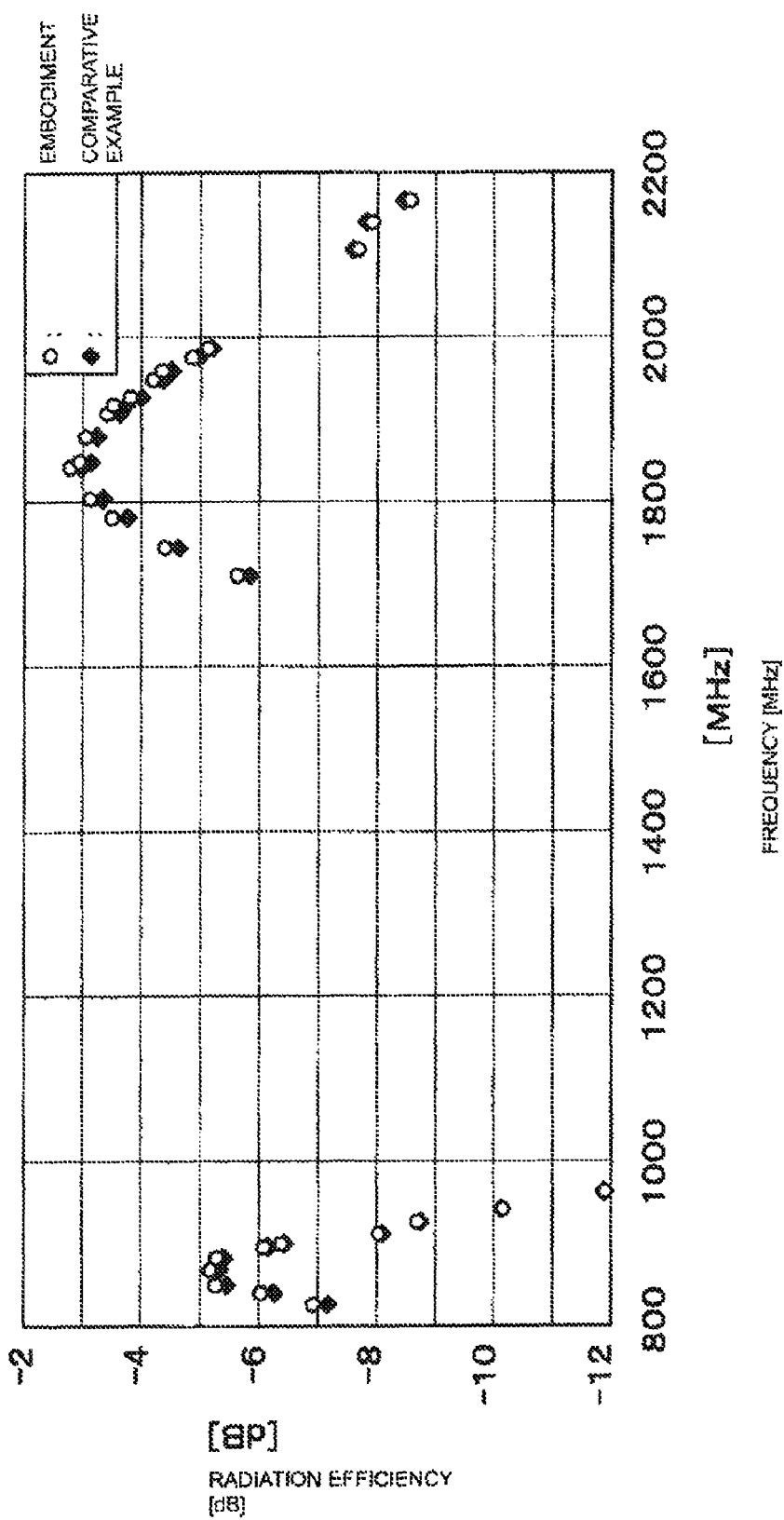
FIG. 4 illustrates frequency characteristics of antenna radiation efficiencies of the embodiment and a comparative example.

The results of FIG. 4 show that the radiation efficiencies of the present embodiment and the comparative example are substantially the same values and falls within a range of ±1.0 dB. In the case of the comparative example, a measurement time of about 20 minutes was required when the radiation efficiency was determined with the rotational speed of the azimuth table 2 set to 3 rpm. In contrast, according to the present embodiment, the measurement of the radiation efficiency was completed within about 2 minutes when two planes only were measured. The measurement time was thus shortened.

In accordance with the present embodiment, the azimuth angle plane radiation pattern S21(R,θ,φ) of the target antenna 4A is measured at two planes of angles φ1 and φ2 with respect to the elevation angle φ and the radiation efficiency η is calculated. The measurement time is thus shortened to about one-tenth the measurement time of the measurement of the radiated electromagnetic field performed over the whole solid angle.

The elevation angle switch 3A is designed to switch the elevation angle φ of the target object 4 (the target antenna 4A) between the two angles φ1 and φ2. The structure of the elevation angle switch 3A is simpler than the related art in which the elevation angle φ is varied in steps of 10 degrees. The entire apparatus is thus compactly structured. A compact anechoic chamber 1 can thus be used to measure the radiation efficiency η of the target antenna 4A.

Furthermore, the target antenna 4A has a radiation pattern of the main beam symmetrical with respect to the elevation angle φ. With the symmetry of the radiation pattern of the main beam, the radiation pattern is measured at two planes of angles φ1 and φ2 mutually perpendicular to each other by 90 degrees, and then spherical-surface integrated. The radiation efficiency η of the target antenna 4A is measured at the same accuracy level that also results when the radiation pattern is measured over the whole solid angle.

In particular, with the voltage standing wave ratio of the target antenna 4A set to within a range of 1-3, the effect of the high-frequency cable 7A connecting to the target antenna 4A is reduced. The radiation pattern becomes constant. The radiation efficiency η of the target antenna 4A can be measured with a measurement accuracy to within ±1 dB.

In accordance with the present embodiment, steps 1 and 2 in FIG. 3 represent a specific example of the first radiation pattern measuring means (i.e., first radiation pattern measuring step), steps 3 and 4 represent an example of the second radiation pattern measuring means (i.e., second radiation pattern measuring step), and step 5 represents a specific example of the radiation efficiency calculating means (i.e., radiation efficiency calculating step).

In accordance with the present embodiment, the first and second angles φ1 and φ2 are respectively set to 0 and 90 degrees. However, the present invention is not limited to this arrangement. It is perfectly acceptable if the first and second angles φ1 and φ2 are different from each other by 90 degrees. For example, the first and second angles φ1 and φ2 may be respectively set to −45 degrees and +45 degrees, for example.

In accordance with the present embodiment, the target antenna 4A is the whip antenna of the cellular phone or the inner chip antenna of the cellular phone. For example, the target antenna 4A may be any of a variety of antennas including a dipole antenna, and a monopole antenna. The biconical antenna is used for the measuring antenna 5 in the above structure. Another type of antenna may be used for the measuring antenna 5.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A radiation efficiency measuring apparatus, comprising:
   a target antenna to be measured,
   a measuring antenna arranged at a position spaced apart from the target antenna by a distance dimension of R,
   an electromagnetic field measuring device, connected to the measuring antenna, for measuring an electromagnetic field radiated by the target antenna,
   elevation angle switching means for switching an elevation angle φ of the target antenna between first and second angles φ1 and φ2, different from each other by 90 degrees,
   azimuth angle rotation means for rotating the target antenna to an azimuth angle θ,
   first radiation pattern measuring means for causing the azimuth angle rotation means to rotate the target antenna to a azimuth angle θ with the elevation angle φ of the target antenna switched to the first angle φ1 by the elevation angle switching means, and measuring a first azimuth angle plane radiation pattern S21(R,θ,φ) with the electromagnetic field measuring device,
   second radiation pattern measuring means for causing the azimuth angle rotation means to rotate the target antenna to the azimuth angle θ with the elevation angle φ of the target antenna switched to the second angle φ2 by the elevation angle switching means, and measuring a second azimuth angle plane radiation pattern S21(R,θ,φ) with the electromagnetic field measuring device, and
   radiation efficiency calculating means for calculating a radiation efficiency η of the target antenna on the basis of the first and second azimuth angle plane radiation patterns S21(R,θ,φ) measured by the first and second radiation pattern measuring means, wherein $$\eta = \frac{4\pi R^2 \sum_\theta \sum_\phi S21^2(R,\theta,\phi)\sin\theta\Delta\phi\Delta\theta}{\lambda^2 G}$$

where λ represents a wavelength of a measuring frequency, G represents a gain of the measuring antenna, Δφ represents a measuring angle step in the elevation angle φ direction, and Δθ represents a measuring angle step in the azimuth angle θ direction.

2. The radiation efficiency measuring apparatus according to claim 1, wherein a radiation pattern of the main beam of the target antenna is symmetrical with respect to the elevation angle φ direction.

3. A radiation efficiency measuring method for measuring a radiation efficiency of a target antenna using a measuring antenna with the target antenna and the measuring antenna spaced apart by a distance dimension of R, comprising:
   a first radiation pattern measuring step of measuring a first azimuth angle plane radiation pattern S21(R,θ,φ) with the target antenna rotated to an azimuth angle θ in a state that an elevation angle φ of the target antenna is switched to a first angle φ1,
   a second radiation pattern measuring step of measuring a second azimuth angle plane radiation pattern S21(R,θ,φ) with the target antenna rotated to the azimuth angle θ in a state that the elevation angle φ of the target antenna is switched to a second angle φ2, the second angle φ2 different from the first angle φ1 by 90 degrees, and
   a radiation efficiency calculating step of calculating a radiation efficiency η of the target antenna on the basis of the first and second azimuth angle plane radiation patterns S21(R,θ,φ) measured in the first and second radiation pattern measuring steps, wherein $$\eta = \frac{4\pi R^2 \sum_\theta \sum_\phi S21^2(R,\theta,\phi)\sin\theta\phi\Delta\theta}{\lambda^2 G}$$

where λ represents a wavelength of a measuring frequency, G represents a gain of the measuring antenna, Δφ represents a measuring angle step in the elevation angle φ direction, and Δθ represents a measuring angle step in the azimuth angle θ direction.

4. The radiation efficiency measuring method according to claim 3, wherein a radiation pattern of the main beam of the target antenna is symmetrical with respect to the elevation angle φ direction.

5. A radiation efficiency measuring apparatus, comprising:
   a target antenna to be measured,
   a measuring antenna arranged at a position spaced apart from the target antenna by a distance dimension of R, an electromagnetic field measuring device, connected to the measuring antenna, to measure an electromagnetic field radiated by the target antenna, elevation angle switch to switch an elevation angle φ of the target antenna between first and second angles φ1 and φ2, different from each other by 90 degrees, azimuth angle rotation driver to rotate the target antenna to an azimuth angle θ, first radiation pattern measuring device to control the azimuth angle rotation driver to rotate the target antenna to a azimuth angle θ with the elevation angle φ of the target antenna switched to the first angle φ1 by the elevation angle switch, and to measure a first azimuth angle plane radiation pattern S21(R,θ,φ) with the electromagnetic field measuring device, second radiation pattern measuring device to control the azimuth angle rotation driver to rotate the target antenna to the azimuth angle θ with the elevation angle φ of the target antenna switched to the second angle φ2 by the elevation angle switch, and to measure a second azimuth angle plane radiation pattern S21(R,θ,φ) with the electromagnetic field measuring device, and radiation efficiency calculator to calculate a radiation efficiency η of the target antenna on the basis of the first and second azimuth angle plane radiation patterns S21(R,θ,φ) measured by the first and second radiation pattern measuring device, wherein $$\eta = \frac{4\pi R^2 \sum_\theta \sum_\phi S21^2(R, \theta, \phi)\sin\theta\Delta\phi\Delta\theta}{\lambda^2 G}$$

where λ represents a wavelength of a measuring frequency, G represents a gain of the measuring antenna, Δφ represents a measuring angle step in the elevation angle φ direction, and Δθ represents a measuring angle step in the azimuth angle θ direction.

6. The radiation efficiency measuring apparatus according to claim 5, wherein a radiation pattern of the main beam of the target antenna is symmetrical with respect to the elevation angle φ direction.

* * * * *